United States Patent
Neti et al.

(10) Patent No.: US 9,945,897 B2
(45) Date of Patent: Apr. 17, 2018

(54) MONITORING OF INSULATION CONDITIONS DURING ELECTRICAL SYSTEM EVENTS USING DIFFERENTIAL CURRENT SENSOR

(71) Applicant: General Electric Company, Schenectady, NY (US)

(72) Inventors: Prabhakar Neti, Rexford, NY (US); Karim Younsi, Balston Lake, NY (US); Konrad Roman Weeber, Rexford, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 150 days.

(21) Appl. No.: 14/982,496

(22) Filed: Dec. 29, 2015

(65) Prior Publication Data
US 2017/0184656 A1 Jun. 29, 2017

(51) Int. Cl.
*H01H 31/12* (2006.01)
*G01R 31/12* (2006.01)
*G01R 31/02* (2006.01)

(52) U.S. Cl.
CPC ....... *G01R 31/1272* (2013.01); *G01R 31/024* (2013.01)

(58) Field of Classification Search
CPC G01R 31/024; G01R 31/1272; G01R 31/342; G01R 31/346
See application file for complete search history.

(56) References Cited

U.S. PATENT DOCUMENTS

| 7,042,229 | B2* | 5/2006 | Lee ................. H01H 31/12 318/478 |
| 8,143,899 | B2 | 3/2012 | Younsi et al. |
| 8,217,644 | B2 | 7/2012 | Younsi et al. |
| 8,581,428 | B2 | 11/2013 | Johansen |
| 8,773,139 | B2 | 7/2014 | Younsi et al. |
| 2005/0035768 | A1 | 2/2005 | Rabach et al. |
| 2005/0218906 | A1* | 10/2005 | Younsi ................. G01R 31/346 324/551 |
| 2014/0084937 | A1 | 3/2014 | Neti et al. |
| 2015/0015303 | A1 | 1/2015 | Sakurai et al. |

FOREIGN PATENT DOCUMENTS

| JP | 2012154879 A | 8/2012 |
| JP | 5350976 B2 | 11/2013 |

OTHER PUBLICATIONS

Bin Lee et al., "An online technique for monitoring the insulation condition of AC machine stator windings", Energy conversion, IEEE Transactions on ,vol. 20 , Issue: 4, p. 737-745, Dec. 2005.
Neti Prabhakar et al., "Online Health Monitoring of Motor Insulation", 2013, retrieved from "https://www.gemeasurement.com/sites/gemc.dev/files/motor_insulation_health_monitoring_white_paper_english_pdf" on Jul. 3, 2015.

* cited by examiner

*Primary Examiner* — Minh N Tang
(74) *Attorney, Agent, or Firm* — Nitin N. Joshi

(57) ABSTRACT

Systems and methods are disclosed for on-line monitoring of the condition of insulation in electrical devices employing a differential current sensor. In certain embodiments a monitor that can be fitted to existing electrical devices by attachment of the sensor to a pair of phase cables is provided. In other embodiments, an electrical device configured with an insulation monitor is provided.

20 Claims, 7 Drawing Sheets

MONITORING OF INSULATION CONDITIONS DURING ELECTRICAL SYSTEM EVENTS USING DIFFERENTIAL CURRENT SENSOR

BACKGROUND

The subject matter disclosed herein relates to systems and methods used to assess the health of high voltage electrical systems.

Alternating current electrical motors are devices capable of converting electrical energy into mechanical energy. Electrical generators are devices that convert mechanical energy into electrical energy. The conversion of energy in these devices take place through an electromagnetic coupling of a stator to a rotor. This coupling requires the presence of conductor windings around a stator or a rotor magnetic core. For appropriate function of the aforementioned electrical devices, the windings are insulated. Due to aging, insulation quality deteriorates over time. Unchecked deterioration of the insulators may lead to device failure, particularly in high voltage applications. It is therefore important to monitor insulator health if one wants reliable operation of the electrical device.

Existing solutions for monitoring the health of winding insulation often require the device to be off-line. One such method relies on measuring partial discharge activity throughout winding insulation, and to calculate figures of merit such as Partial Discharge Extinction Voltage (PDEV) and/or Partial Discharge Inception Voltage (PDIV). This approach requires the use of specialized sensors and leads to considerable down time. The available solutions for on-line device monitoring employ a large number of sensors or employ sensors that do not provide high sensitivity or accuracy. This results in monitoring methods that are expensive, rely on subjective strategies, or are based on very large amounts of data.

BRIEF DESCRIPTION

In one embodiment, an insulation monitor system is provided. The monitor system includes: at least one differential current sensor configured to measure leakage current data for an AC electrical device having one or more insulated components while the AC electrical device is in operation; a processor configured to calculate one or both of an insulation parameter or a performance indicator using the leakage current data; and a data storage device configured to record one or more of the leakage current data, the calculated insulation parameter, or the calculated performance indicator.

In another embodiment, a method for calculating performance indicators related to a system event in an on-line AC electrical device is provided. In accordance with this method, a plurality of leakage currents measurements are measured during a system event. The plurality of leakage current measurements are recorded. At least one insulation parameter is calculated using the plurality of leakage current measurements. A performance indicator is calculated based on the at least one insulation parameter.

In another aspect, a method for monitoring condition of insulation in an AC electrical device is provided. In accordance with this method a plurality of differential current measurements associated with at least one pair of phase cables of the AC electrical device are measured during regular operation. At least one insulation parameter is calculated using the plurality of differential current measurements. At least one performance indicator is calculated from the at least one insulation parameter or the plurality of differential current measurements after a system event. The at least one insulation parameter or the at least one performance indicator is compared with at least one alarm criteria. An alarm is generated when the compliance with the at least one alarm criteria fails.

The method and the devices described herein enables on-line monitoring of the condition of winding insulation in electrical devices. This capability substantially decreases the chance of an unexpected failure, resulting in an improved reliability of the electrical system.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
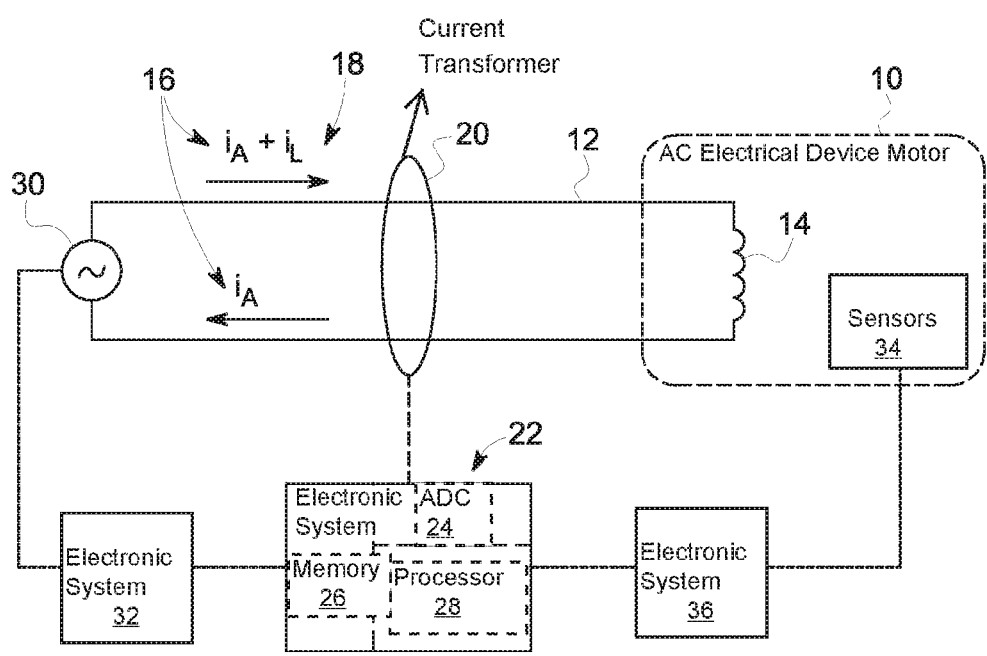
FIG. 1 illustrates an implementation of an insulation monitor attached to a pair of phase cables in an electrical device, and connected to other sensors for improved insulation condition assessment, in accordance with aspects of the present disclosure.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decision must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

The present description relates to monitoring the condition of winding insulation in high voltage electrical devices employing high sensitivity differential sensors. Electrical devices such as AC motors and generators perform the transformation between electrical and mechanical energy through electromagnetic coupling of a stator and a rotor. For appropriate coupling, the stator is provided with windings, insulated conductors that generate a magnetic field whenever a variable current travels through it. Failure in the insulation of stator windings is one cause of failure and damage to electrical devices.

During normal operation of a motor or generator, some current leakage through the winding insulation is observed. As the condition of the insulation worsens, the characteristics of the current leakage change. In particular, the phenomenon of partial discharge becomes more pronounced and the winding insulation behaves less as a capacitor and more as a resistor. This change is commonly quantified by performance indicators such as the Partial Discharge Inception Voltage or Partial Discharge Extinction Voltage. Various implementations presented herein obtain similar performance indicators to monitor insulation health in an on-line context (i.e., during normal operation of the device), employing high sensitivity sensors that measure leakage current during normal operating conditions. Such on-line monitoring is in contrast to conventional approaches that must be performed when the device is off-line.

In one implementation, an insulation monitor is provided. The insulation monitor employs at least one high sensitivity differential current transformer to measure the leakage current and may employ a computer system to store the acquired measurements, calculate performance indicators, record a history of the indicators and identify one of several alarm conditions. In some implementations, the insulation monitor may be retrofitted to existing electrical devices. In some implementations, the insulation monitor may be configured to receive data from temperature, humidity or other relevant sensors and employ that data to identify one of several alarm conditions, further improving monitor performance.

In certain aspects, an AC motor or generator with an insulation monitor is provided. The insulation monitor may be pre-configured with, or may be able to access, known parameters from the electrical device. These characteristic may include, but are not limited to, baseline leakage currents, baseline measured capacitance, operational voltage rating, operational temperature rating, etc. The insulation monitor may employ the known parameters along with readings from the differential current sensor to identify alarm conditions related to the health of the insulation. The insulation monitor may also be pre-configured with alarm conditions specific to the electric device or may be programmable to specify such alarm conditions.

A method for monitoring the condition of winding insulation in AC motors or generators employing a differential current transformer is also provided. The method enables tracking the health of winding insulation over a period of time, such as over the lifetime of the electrical device, during the course of normal operations and producing alarms when changes in winding insulation are detected. Some variations of the method employ measuring leakage current during start-up, normal operations, shutdown cycles, and other device events, and automatically calculating key performance indicators indicative of insulation health. In addition, trends of the historic performance indicators or of the insulation parameters of the electrical device may be generated, monitored, and/or tracked. Alarm conditions may also be compared with the calculated performance indicators and data received from other sensors.

With the foregoing in mind, FIG. 1 illustrates a diagram of an implementation example. An AC electrical device motor 10 is powered by at least a pair of phase cables 12 which push current through the insulated windings 14. The motor 10 may be provided with additional phase cables that are not depicted. The pair of phase cables 12 can be clamped into a high sensitivity differential current transformer 20.

During normal operation of the motor, a power supply 30 will cause the pair of phase cables to carry a load current $i_A$ 16 and a leakage current $i_L$ 18. In this configuration, the differential current transformer 20 will provide a voltage reading proportional to the leakage current 18. The current transformer 20 is capable of accurately measuring the leakage current 18 even when the load current 16 is orders of magnitude larger or when the voltage provided by power supply 30 varies considerably.

In the depicted example, an electronic system 22 comprising an analog to digital converter (ADC) 24, a memory 26 and a processor 28 is connected to the differential current sensor 20 through a cable. The ADC 24 digitizes the leakage current data provided by the current transformer 20 and stores these values it in the memory 26 with a corresponding timestamp. The processor 28 may subsequently or simultaneously calculate into one or more insulation parameters using the leakage current measurements and store these calculated indicators in the memory 26. The electronic system 22 may also receive current or voltage data from the power supply 30 as timestamped by and digitized by an electronic system 32.

The system may also be provided with other sensors 34, as illustrated in the example. These sensors may include temperature sensors, humidity sensors, or sensors of any data relevant to the normal operation of the motor 10. The electronic system 22 may also receive digitized and timestamped data from the sensor(s) 34 as processed by an electronic system 36. In some implementations, power supply 30 or sensor(s) 34 can be connected directly to an ADC in the electronic system 22. In possession of the power supply data, the leakage current data, other sensor data and the corresponding timestamps, the processor may calculate insulation performance indicators, as discussed in detail below. In some implementations, the electronic system 22 may also be provided with alarm conditions (i.e., thresholds) which can be compared to the calculated insulation performance indicators. The electronic system may trigger an alarm when compliance of the system fails or deteriorates, as determined based on this comparison.

Figure 2:
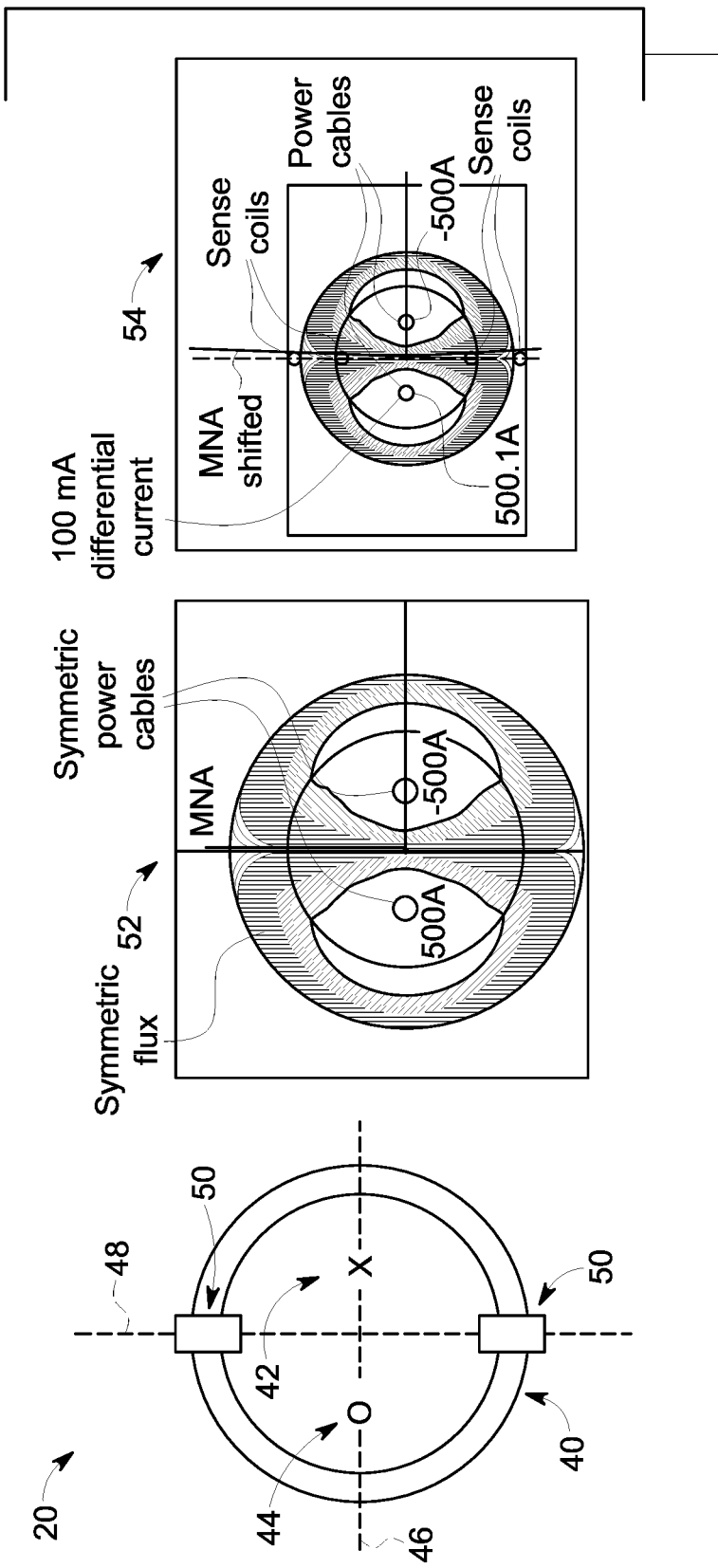
FIG. 2 is an illustration of a cross section of an embodiment of a high sensitivity differential current sensor, along with gradient maps of the electromagnetic flux generated in the sensor as result of current flow, in accordance with aspects of the present disclosure.

With respect to the high sensitivity differential current transformer 20 discussed above, this sensor allows accurate measurement of small differential currents embedded in the large load currents commonly observed in high voltage AC generators and motors. An example of such sensor is depicted in FIG. 2.

In this example of a high sensitivity differential current transformer 20, a magnetic core 40 with a central opening is equipped with two precisely marked positions 42 and 44, placed in a reference diameter 46. The two positions are symmetric to each other with respect to an orthogonal diameter 48. Additionally, at least two sense coils 50 can be placed in the axis 48. To set up the transformer to measure differential currents in a pair of phase cables, each cable is placed in either the positions 42 or 44, such that the current flows in opposite directions. Variations in the current going through each cable generates a magnetic flux in the magnetic core 40. By setting the pair of cables in opposite directions, when the currents are identical, the flux generated in the axis 48 by the cables cancel each other. Perturbations of the magnetic flux in the axis 48 can be measured by the sense coil 50.

Graph 52 shows the formation of the magnetically neutral axis (MNA) in the position of sense coils when the currents in both cables are identical. Graph 54 shows that when a differential current of 0.1 A is embedded in a current of 500.1 A the MNA shifts away from the position corresponding to sense coils. This produces a signal in the sense coils proportional to the differential currents. When the pair of cables placed in the high sensitivity differential current transformer is connected to an insulated winding, the differential current observed corresponds to the leakage current. The principle of this high sensitivity differential current transformer 20 can be expanded to different geometries for the core, different positions for the cables, and different placements of sense coils. The present specification contemplates using these variations for current transformers.

Figure 3:
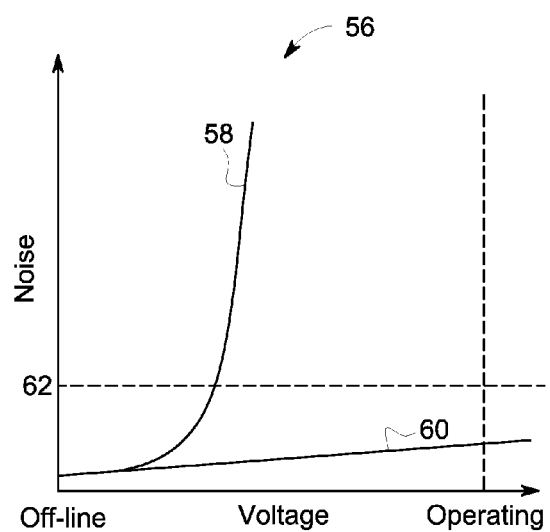
FIG. 3 is a graph that illustrates the noise behavior of leakage current sensors, in accordance with aspects of the present disclosure.

The improvement provided by a high sensitivity sensor 20 is illustrated by the graph 56 in FIG. 3. The graph illustrates the noise performance of a high sensitivity differential current sensor (line 60) and a regular current sensor (line 58) while measuring the differential current in a pair of phase cables in a motor. A threshold 62 for the noise is also depicted. If the noise is above the threshold, the data on leakage currents is not sufficiently accurate and, thus, winding insulation conditions cannot be assessed. As the voltage increases from the off-line to the operating voltage of the motor, the noise 58 of a regular differential current sensor increases above the threshold 62. This often takes place at a voltage much smaller than the operating voltage. Therefore, any useful method employing a conventional sensor to measure leakage currents requires the machine to be off-line. In contrast, the high sensitivity differential sensor 20 is capable of measuring differential currents with high accuracy at the operating voltage, as shown by line 60. This enables the sensor 20 to be used to measure leakage currents while the electrical device is on-line.

For a winding insulation in good conditions, the leakage current measured is mostly "capacitive", i.e., the current is in quadrature with the voltage. As the condition of the insulation worsens, the leakage current becomes "resistive". This change can be observed by directly inspecting the leakage currents. The change of the leakage current from "capacitive" to "resistive" can also be obtained from insulation parameters such as insulation capacitance, dissipation factor (DF), resistive leakage current, etc. The insulation parameters are figures of merit that can be calculated from the measured leakage currents. The embodiments of insulation parameters are not limited to the listed examples and contemplate all figures of merit that employ the described principle.

Furthermore, since the readings are accurate over a range of voltages, the monitor is capable of assessing performance indicators for the winding insulation during device events, situations in which the loads or the voltages change substantially. Examples of device events include, but are not limited to, startup and shutdown cycles for the device, change of a load to a motor, change of electric load to a generator, etc. This specification also contemplates the use of special monitoring cycles introduced for the sole purpose of obtaining performance indicators (i.e., an on-line insulation assessment event).

Figure 4:
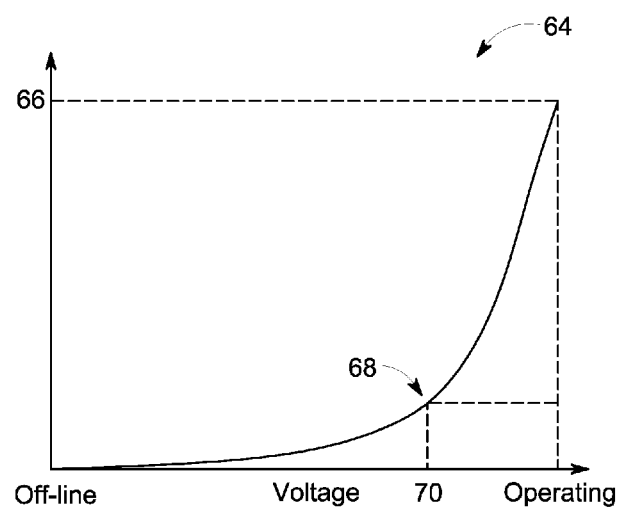
FIG. 4 is a graph that illustrates a method to calculate the PDIV and the Tip Up in accordance with respect of the present disclosure.

An example of a performance indicators obtained during a startup cycle are illustrated by graph 64 in FIG. 4. This graph illustrates the behavior of an insulation parameter 66 calculated from the measured leakage current as a function of the voltage during the startup cycle. As the voltage increases from off-line towards the operating voltage, a change in the leakage current takes place, increasing the value of the insulation parameter 66. The rate of this increase can itself increase at an inflection point 68. The voltage 70 at the inflection point 68 can be taken as the voltage at which significant partial discharge activity starts, known in the art as Partial Discharge Inception Voltage (PDIV). As the condition of the insulation worsens, the PDIV decreases. The ratio of the PDIV over the operating voltage may also be employed as a performance indicator. Alternatively, the system may employ other methods to identify the PDIV, such as an absolute or a relative threshold for insulation parameter 66, instead of employing the inflection point 68.

The gap between the insulation parameter 66 at PDIV and the dissipation factor at the operating voltage is conventionally known as Tip Up 72. As the condition of the insulation worsens, the Tip Up value increases, and thus, the Tip Up can be employed as a performance indicator.

Figure 5:
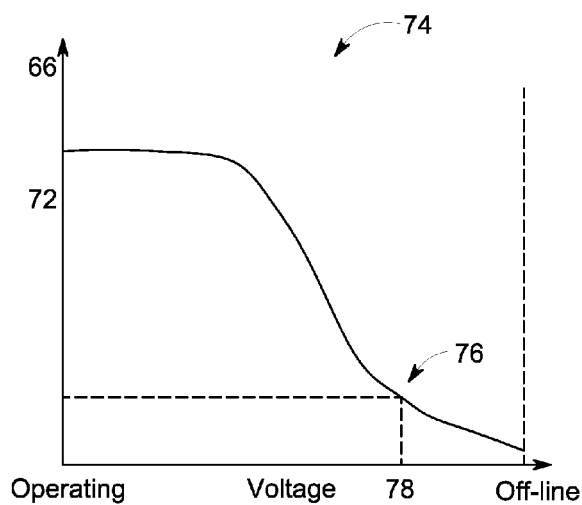
FIG. 5 is a graph that illustrates a method to calculate the PDEV in accordance with respect of the present disclosure.

An example of a performance indicator obtained during a shutdown cycle as illustrated by graph 74 in FIG. 5. This graph illustrates the behavior of an insulation parameter 66 calculated from the measured leakage current as a function of the voltage during a shutdown cycle. In this graph, the voltage axis is a decreasing axis with the operating voltage to the left and the off-line voltage to the right. As the voltage during shutdown decreases, the changes in the insulation parameter may take place, decreasing the value of the insulation parameter 66. The rate of decrease may change considerably at an inflection point 76. The load voltage 78 at the inflection point 76 can be taken as the voltage at which partial discharge activity ceases, known in the art as Partial Discharge Extinction Voltage (PDEV). As the condition of the insulation worsens, the PDEV decreases. Alternatively, the system may employ other methods to identify the PDIV such as an absolute or a relative threshold for insulation parameter 66 instead of employing the inflection point 68.

The examples in graphs 64 in FIGS. 4 and 74 in FIG. 5 illustrate an insulation parameter 66 that monotonically increases as partial discharge activity increases and the leakage current becomes "resistive" as is the case with dissipation factor. This specification also contemplates performance indicators obtained from insulation parameters that monotonically decrease or that are non-monotonic with respect to the specified changes in the characteristic of the leakage currents. In addition, inflection points, thresholds, zero-crossings and maximum/minimum of parameters calculated using leakage current data as discussed herein may be used in the calculation of other performance indicators.

Figure 6:
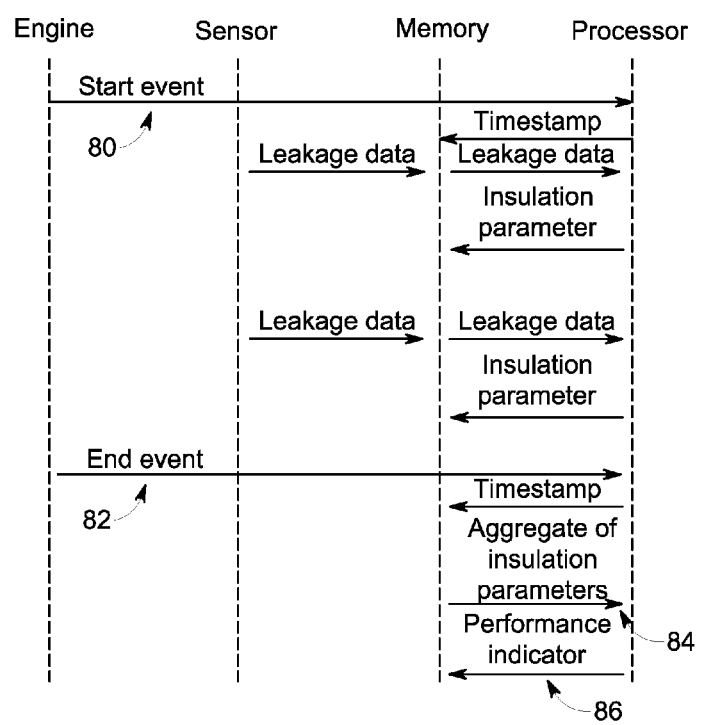
FIG. 6 is a sequence diagram illustrating how performance indicators may be calculated as part of routine monitoring in accordance with aspects of the present disclosure.

With the foregoing in mind, FIG. 6 provides an example of a sequence diagram for the evaluation of performance indicators for device events. During normal monitoring, the system stores current leakage data in the memory and the processor routinely, i.e., periodically or continuously, transforms that data into insulation parameters. When a device event starts 80, the processor, through a signal from the engine, the sensor, an operator or another source, receives a notification and stores a timestamp. The processor system proceeds with the routine collection of current leakage data and transformation into insulation parameters. When the device event ends 82, the processor receives a notification and stores a second timestamp. Accordingly, the processor then retrieves 84 all the insulation parameters generated during the event(s) and calculates a performance indicator such as the PDIV, PDEV and Tip Up. The calculated indicators are then stored in the data storage device 86. In some embodiments, the processor may employ data obtained from other sensors to be used in the calculation of a performance indicator.

In some embodiments, a history analyzer is provided. This history analyzer is configured to process the several stored performance indicators and insulation parameters in the data storage and, taking into account their timestamp, obtain new performance indicators that employ timing as a factor. The performance indicators created may be from integration, differentiation, averaging, maximization, minimization, rate of change or other operations of relevance for a time sequence of insulation parameters or performance indicators. It may be noted that the performance indicators generated by the history analyzer are themselves performance indicators. Therefore, statistically derived or aggregate performance indicators such as the derivative of an average are also contemplated in this specification.

In some implementations, alarm criteria are provided. The alarm criteria provide allowable values and/or threshold cutoffs for various notifications, conditions or levels. Said criteria can be provided by an operator or it can be supplied with the monitoring system. In some embodiments, the alarm criteria may be created employing information from the electrical device. This alarm criteria may specify thresholds for acceptable or unacceptable insulation parameters or performance indicators. Furthermore, the alarm criteria may be used to evaluate other information stored in the insulation monitor memory, including data from external sensors such as temperature sensors. Alarm criteria used to evaluate combinations of different insulation parameters, performance indicators and external sensor data are also contemplated. An example of such criterion is an alarm that provides a limit to the rate of increase in DF. In a different example, an alarm may provide a limit to the rate of decrease in PDIV that is triggered only when the Tip Up increases above a value. In a further example, an alarm may be triggered only when the PDEV corresponding to two different phases of the electrical device falls outside predetermined range and the stator temperature increases above a specified level. These examples do not exhaust the possibility of alarm criteria that may be provided. From time to time, the monitor may verify compliance of the data stored in it with the alarm criteria and, upon failure of one of them, will raise an alarm. Implementations that include alarm thresholds facilitate routine on-line monitoring of insulation parameters, with no need of bringing the device off-line.

Figure 7:
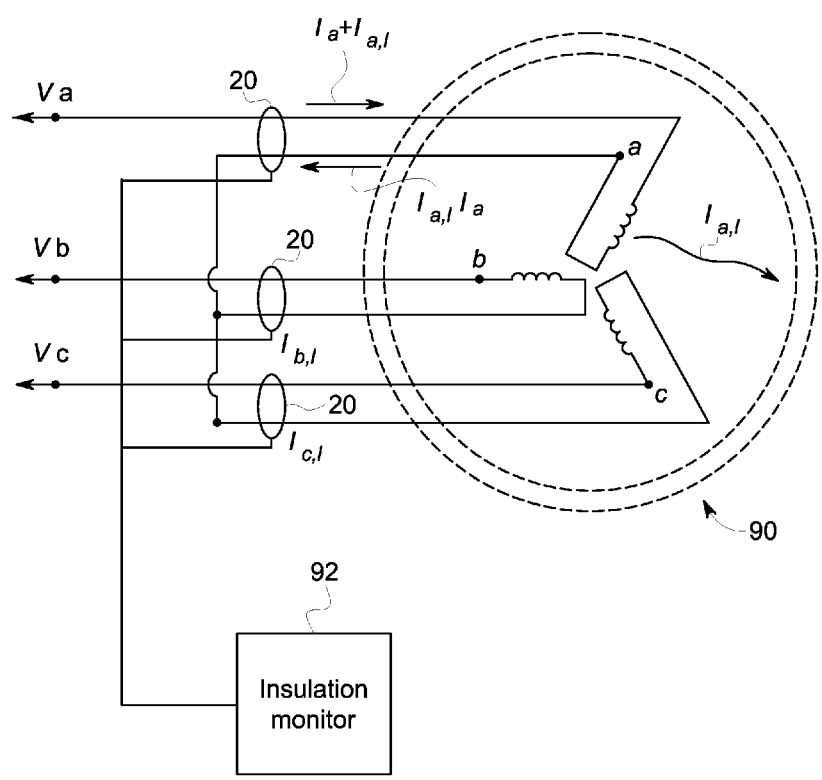
FIG. 7 illustrates an embodiment of a three-phase motor configured with an insulation monitor as discussed herein.

In further implementations, an AC electric motor supplied with a custom insulation monitor is provided. Versions of this implementation provide for three high sensitivity differential current sensors 20 attached to each phase of a tri-phasic AC motor 90, as illustrated in FIG. 7. In these embodiments, alarm criteria in the insulation monitor 92 may be pre-configured and calibrated to the instrument. Furthermore, in some embodiments the electric motor 90 may be configured to automatically communicate notify the insulation monitor 92 about the beginning and/or the end of system events. The integration between motor 90 and monitor 92 in these may increase the quality of the monitoring and, therefore, the reliability of the device. Some implementations provide for temperature sensors attached to the windings in the motor 90 and connected to the insulation monitor 92. Other embodiments contemplate electrical generators supplied with a custom insulation monitor, wherein the insulation monitor is similarly integrated.

Several of the embodiments encompass a method to monitor the health of winding insulation employing high sensitivity differential current sensors. The use of these sensors enables different alarms that can be triggered during regular operations, and prevent device failure. In some embodiments, the method comprises two routines, one for operations and one for monitoring. During operations, leakage currents are measured and insulation parameters are calculated and recorded. In some embodiments, performance indicators are calculated and recorded at the end of device events. The monitoring routine evaluates changes in stored insulation parameters and performance indicators from time to time and, in some embodiments, trigger alarms based on pre-set criteria.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An insulation monitor system comprising:
    at least one differential current sensor configured to measure leakage current data for an AC electrical device having one or more insulated components while the AC electrical device is in operation;
    a processor configured to calculate one or both of an insulation parameter or a performance indicator using the leakage current data while the AC electrical device is in operation; and
    a data storage device configured to record one or more of the leakage current data, the calculated insulation parameter, or the calculated performance indicator.

2. The monitor in claim 1 wherein the performance indicator is at least one of a PDIV, a PDEV or a Tip Up.

3. The monitor of claim 1 in which the insulation parameter is at least one of a DF, an insulation capacitance or a leakage current.

4. The monitor of claim 1 wherein the differential current sensor is a high sensitivity differential current transformer.

5. The monitor of claim 1 wherein the processor is configured to generate an alarm when an alarm criteria based on at least one of the performance indicators or insulation parameters is satisfied.

6. The monitor of claim 1 wherein the processor is configured to
    receive external sensor data from external sensors; and
    generate an alarm when an alarm criteria based on at least one of the performance indicators, the insulation parameters or the external sensor data is satisfied.

7. The monitor of claim 6 wherein the external sensors include temperature sensors or humidity sensors.

8. The monitor of claim 1 wherein the at least one differential current sensor is fitted to at least one pair of phase cables in the AC electrical device and configured to receive notifications about system events from an operator.

9. The monitor of claim 1 wherein the at least one differential current sensor is fitted to at least one pair of phase cables in the AC electrical device and configured to receive notifications automatically from the AC electrical device.

10. The monitor of claim 1 wherein the processor is provided with a history analyzer.

11. A method for calculating performance indicators related to a system event in an on-line AC electrical device comprising:
   measuring a plurality of leakage current measurements during a system event;
   recording the plurality of leakage current measurements;
   calculating at least one insulation parameter using the plurality of leakage current measurements;
   calculating a performance indicator based on the at least one insulation parameter;
   receiving external sensor data from external sensors; and
   generating an alarm when an alarm criteria based on at least one of the performance indicators, the at least one insulation parameter or the external sensor data is satisfied.

12. The method of claim 11 wherein the system event is a start-up cycle and the performance indicator is at least one of a PDIV or a Tip Up.

13. The method of claim 11 wherein the system event is a shutdown cycle and the performance indicator is a PDEV.

14. The method of claim 11 wherein the system event is a monitoring cycle.

15. The method of claim 11 wherein the system event is a change in load.

16. A method for monitoring condition of insulation in an AC electrical device comprising:
   measuring a plurality of differential current measurements associated with at least one pair of phase cables of the AC electrical device while the AC electrical device is in operation;
   calculating at least one insulation parameter using the plurality of differential current measurements;
   calculating at least one performance indicator from the at least one insulation parameter or the plurality of differential current measurements during a system event;
   comparing the at least one insulation parameter or the at least one performance indicator with at least one alarm criteria; and
   generating an alarm when the compliance with the at least one alarm criteria fails as determined based on the comparison of the at least one insulation parameter or the at least one performance indicator with the at least one alarm criteria.

17. The method of claim 16 wherein the system event is a start-up cycle and the performance indicator is at least one of a Tip Up or a PDIV.

18. The method of claim 16 wherein the system event is a shutdown cycle and the performance indicator is a PDEV.

19. The method of claim 16 wherein the system event is a monitoring cycle.

20. The method of claim 16 wherein the compliance with the at least one alarm criteria further comprises reference to external sensor data from an external sensor.

* * * * *